United States Patent [19]

Konrad et al.

[11] Patent Number: 5,972,572
[45] Date of Patent: Oct. 26, 1999

[54] DEVELOPER FOR IRRADIATED, RADIATION-SENSITIVE RECORDING MATERIALS

[75] Inventors: Klaus Peter Konrad, Gensingen; Steffen Denzinger, Mainz; Andreas Elsaesser, Idstein, all of Germany

[73] Assignee: Agfa-Gevaert AG, Leverkusen, Germany

[21] Appl. No.: 09/185,030

[22] Filed: Nov. 3, 1998

[30] Foreign Application Priority Data

Dec. 12, 1997 [DE] Germany ............... 197 55 295

[51] Int. Cl.[6] ....................................... G03C 5/30
[52] U.S. Cl. ..................... 430/331; 430/444; 430/466; 430/493
[58] Field of Search ..................... 430/331, 493

[56] References Cited

U.S. PATENT DOCUMENTS

| | | | |
|---|---|---|---|
| 3,954,472 | 5/1976 | Walls | 430/154 |
| 4,716,098 | 12/1987 | Mack et al. | 430/331 |
| 5,008,032 | 4/1991 | Diessel et al. | 510/434 |
| 5,009,805 | 4/1991 | Perner et al. | 510/434 |
| 5,368,982 | 11/1994 | Suzuki et al. | 430/256 |

FOREIGN PATENT DOCUMENTS

| | | |
|---|---|---|
| 0 004 014 | 9/1979 | European Pat. Off. . |
| 0 180 122 | 5/1986 | European Pat. Off. . |
| 0 323 836 | 7/1989 | European Pat. Off. . |
| 0367049 | 5/1990 | European Pat. Off. . |
| 0368214 | 5/1990 | European Pat. Off. . |
| 0 602 736 | 6/1994 | European Pat. Off. . |
| 42 24 205 | 1/1993 | Germany . |

*Primary Examiner*—Hoa Van Le
*Attorney, Agent, or Firm*—Foley & Lardner

[57] ABSTRACT

A developer for irradiated, radiation-sensitive recording materials, in particular for the production of offset printing plates, which contains water, a compound which is alkaline in aqueous solution and a copolymer which acts as an emulsifier and has units of (I) a hydrophobic vinyl compound which has alkyl radicals having up to 30 carbon atoms and (II) a hydrophilic, ethylenically unsaturated carboxylic acid. Some of the carboxyl groups of the copolymer are esterified with reaction products of (A) ($C_1$–$C_{30}$)alkanols, ($C_8$–$C_{25}$)alkanoic acids, ($C_1$–$C_{12}$)alkylphenols or di($C_1$–$C_{20}$)alkylamines with (B) ($C_2$–$C_4$)alkylene oxides or tetrahydrofuran.

20 Claims, No Drawings

DEVELOPER FOR IRRADIATED, RADIATION-SENSITIVE RECORDING MATERIALS

BACKGROUND OF THE INVENTION

1. Field of the Invention

The invention relates to a developer for irradiated, radiation-sensitive recording materials which contains water and at least one compound which is alkaline in aqueous solution. The developer is particularly suitable for developing radiation-sensitive recording materials from which offset printing plates are produced. The invention is also directed to methods of making and using the developer.

2. Description of Related Art

Aqueous alkaline developers for recording materials should generally meet a number of requirements. For example, they should have high productivity, i.e., the developing capacity should decrease as little as possible after prolonged use and hence increased contamination by detached components of the layer. The so-called "tone limit" at which the developer is spent and the layer is removed only incompletely from the nonimage parts should be as high as possible. The developers should develop the recording materials as rapidly and completely as possible. This is particularly important in the mechanical production of the printing plates in processing lines. Owing to the short cycle times, a development time of substantially less than 30 seconds may be necessary.

For ecological and economic reasons, it is advantageous if the developer can be offered in the form of a liquid concentrate which the consumer himself dilutes with water. Although the hardness of the water differs from region to region, this should not influence the properties of the ready-to-use developer. Thus, it is desirable that the developer be substantially unaffected by water hardness.

During development, neither foam nor solid precipitates should form. The latter might contaminate the development units and hence give rise to a high level of maintenance or even settle on the developed recording material.

Moreover, the developer solution laden with layer residues should be compatible with the gumming solutions used in the processing line. Owing to the unavoidable entrainment of contaminated developer solution by printing plates passing through, layer residues may accumulate after a relatively short time in the downstream storage container of the gumming solution. In the most unfavorable case, this gives rise to solid precipitates which, after a phase of concentration, are redeposited on the printing surface of the developed printing plate via the roller rail system of the gumming station and can thereby render the plate unusable.

EP-A 0 323 836 describes aqueous alkaline developers for positive- and negative-working recording materials. In addition to an alkaline composition, they contain a thickener which adjusts their viscosity to 5 to 10,000 cps. If necessary, the developers may also contain organic solvents, such as benzyl alcohol or ethylene glycol monophenyl ether. Developers for positive-working recording material may furthermore contain surfactants, in particular anionic or amphoteric surfactants. The thickeners used are fine silicate powders or water-soluble polymers such as starch, gum arabic, sodium alginate, pectin, viscose, methylcellulose, carboxymethylcellulose, polyvinyl alcohol, polyvinyl methyl ether, or polyvinyl-pyrrolidones.

A very specific aqueous alkaline developer for negative-working recording materials for the production of offset printing plates is disclosed in EP-A 0 602 736. This developer permits particularly short development times and prevents excessive deposits in the processing units. Moreover, it is said to rapidly dissolve deposits already formed. This developer contains an organic solvent, an anionic surfactant, an alkali metal tetraborate, an alkali metal salt of an aliphatic monocarboxylic acid, an alkali metal salt of an aliphatic dicarboxylic acid, an alkali metal citrate, a poly(alkylene glycol), an alkali metal salt of a hydroxylated aromatic carboxylic or sulfonic acid, and an alkaline buffer system which ensures an alkaline pH.

A developer suitable for the production of negative-working printing plates is also the subject of U.S. Pat. No. 3,954,472. It contains ammonium sulfite and polyvinylpyrrolidone dissolved in water and an alcohol, in particular n-propanol. The polyvinylpyrrolidone acts as a gumming composition.

Polyvinylpyrrolidone or a copolymer having units of N-vinyl-pyrrolidone is also used in the aqueous alkaline developer according to DE-A 42 24 205. The developer furthermore contains an alkaline agent such as NaOH, KOH, $Na_2CO_3$, $K_2CO_3$, sodium silicate, potassium silicate, trisodium phosphate, or tripotassium phosphate. If necessary, a surfactant of the alkali metal sulfate or alkali metal sulfonate type, an antifoam and an organic solvent, such as benzyl alcohol or ethylene glycol monomethyl ether, ethylene glycol monoethyl ether, ethylene glycol monobutyl ether or ethylene glycol monophenyl ether, may also be added. It is envisaged for use in particular for the development of color proof materials, where it prevents the formation of stains in the nonimage parts.

EP-A 0 004 014 discloses a particularly productive developer for recording materials having exposed, negative-working layers of diazonium salt polycondensates and water-insoluble organic polymers. It contains an anionic wetting agent, polyvinyl alcohol, poly(N-vinyl-N-methylacetamide), benzyl alcohol, glyceryl triacetate and a buffer which ensures a pH in the range from 4 to 8. Since only high-boiling organic solvents are used in this developer, its composition remains virtually constant even on prolonged standing in open containers.

With the aqueous alkaline developer according to EP-A 0 180 122, it is possible to achieve particularly rapid and good development of exposed, negative-working photoresist layers. It also has a long life, can be used in automatic developing machines and prevents the formation of cakes and small cakes of detached layer components. In addition to water and an alkaline agent, it contains a complexing agent, an anionic surfactant, an alkanoic acid or a salt thereof, a buffer substance and an emulsifier, which is preferably poly(N-vinyl-N-methylacetamide), polyvinyl alcohol, dextrin, gum arabic, or a cellulose ether.

Although the stated polymeric emulsifiers result in a substantial improvement in the developer properties, they also have disadvantages. For example, they substantially affect the viscosity, i.e., they result in a relatively high viscosity even when they are contained in the developer only in small amounts. However, having as low an initial viscosity as possible and a moderate increase in viscosity with increasing contamination of the developer by detached layer components are important factors for minimizing the mechanical load on components of the processing line (for example, pumps and hose connection) on the one hand and, on the other hand, for counteracting premature sludge formation in the developing section of the processing machine, resulting in greater cleaning work when the developer is changed. With the known emulsifiers, it is always only a compromise that it achieved. Owing to the strongly viscosity-increasing effect of the known emulsifiers, their amount in the developer solution should often be limited.

SUMMARY OF THE INVENTION

With the developers known to date, it was not possible simultaneously to meet all the desired requirements including no formation of cakes or small cakes by detached layer components in the developer station or in the downstream gumming station of the printing plate processing machine, while at the same time providing low initial viscosity and small viscosity increase with growing contamination.

It is therefore an object of the present invention to provide a corresponding improved developer for radiation-sensitive recording materials. It is also an object to provide methods of making and using the developer.

Surprisingly, it was possible to achieve this object and others by using emulsifiers, some of which have been described to date only as a component of liquid detergents, but not proposed as a component of developers.

In accordance with these and other objectives, there has been provided in the present invention a developer for an irradiated, raditation-sensitive recording material comprising: (a) water, (b) at least one compound which is alkaline in aqueous solution, and (c) at least one copolymer acting as an emulsifier and comprising units of (I) at least one hydrophobic vinyl compound which has one or more alkyl radicals having up to 30 carbon atoms, and (II) at least one hydrophilic, ethylenically unsaturated carboxylic acid, some of the carboxyl groups in this unit being esterified with a reaction product of (A) one or more of ($C_1$–$C_{30}$)alkanols, ($C_8$–$C_{25}$)alkanoic acids, ($C_1$–$C_{12}$) alkyl-phenols, or di($C_1$–$C_{20}$)alkylamines with (B) one or more of ($C_2$–$C_4$) alkylene oxides or tetrahydrofuran, wherein the molar ratio of (A):(B) in the reaction product is in the range from 1:2 to 1:50.

In accordance with the invention, there is also provided a developer for an irradiated, radiation-sensitive recording material in the form of a liquid concentrate comprising: at least one compound which is alkaline in aqueous solution, and at least one copolymer comprising units of (I) at least one hydrophobic vinyl compound which has one or more alkyl radicals having up to 30 carbon atoms and (II) at least one hydrophilic, ethylenically unsaturated carboxylic acid, some of the carboxyl groups in this unit being esterified with a reaction product of (A) one or more ($C_1$–$C_{30}$)alkanols, ($C_8$–$C_{25}$)alkanoic acids, ($C_1$–$C_{12}$)alkyphenols, or di($C_1$–$C_{20}$)alkylamines with (B) ($C_2$–$C_4$)alkylene oxides or tetrahydrofuran, wherein the molar ratio of (A):(B):in the reaction product is in the range from 1:2 to 1:50.

There is also provided a method of developing an irradiated radiation sensitive layer, comprising treating the layer with a developer as described above.

Further objects, features, and advantages of the invention will become apparent hence the detailed description that follows.

DETAILED DESCRIPTION OF PREFERRED EMBODIMENTS

The present invention relates to a developer for irradiated, radiation-sensitive recording materials which contains water and at least one compound which is alkaline in aqueous solution, which developer contains at least one copolymer acting as an emulsifier and comprising units of (I) at least one hydrophobic vinyl compound which has alkyl radicals having up to 30 carbon atoms, and
(II) at least one hydrophilic, ethylenically unsaturated carboxylic acid, some of the carboxyl groups in these units being esterified with reaction products of
  (A) ($C_1$–$C_{30}$)alkanols, ($C_8$–$C_{25}$)alkanoic acids, ($C_1$–$C_{12}$)alkylphenols or di($C_1$–$C_{20}$)alkylamines with
  (B) ($C_2$–$C_4$)alkylene oxides or tetrahydrofuran, the molar ratio (A):(B) being in the range from 1:2 to 1:50.

The molar ratio of the units (I) and (II) is generally in the range of from 30:70 to 70:30, preferably 40:60 to 60:40. In a particularly preferred embodiment, the copolymer has an alternating structure and the ratio (I):(II) is hence about 50:50.

The hydrophobic vinyl compound which has alkyl radicals having up to 30 carbon atoms may include any such compound and preferably includes straight-chain or branched alkenes, where the double bond may be present in the carbon chain or at one end thereof. Accordingly, the alkyl radicals in said compound may have from 1 to 30 carbon atoms. ($C_4$–$C_{28}$)alkenes, e.g., butene, isobutene, 2,4,4-trimethylpentene, hexene, octene, decene, dodecene, tetradecene, octadecene, eicosene, docosene and others, provided that they are polymerizable, may be particularly advantageously used. Among these in turn, straight-chain and branched alkenes having 6 to 10 carbon atoms are preferred. Mixtures of alkenes, in particular of branched alkenes, are also suitable, for example of 2,4,4-trimethylpent-1-ene and 2,4,4-trimethylpent-2-ene (diisobutene).

The ethylenically unsaturated carboxylic acids may be any desired, and are preferably α,β-unsaturated carboxylic acids having 3 to 8 carbon atoms. They may be mono-, di- or tricarboxylic acids, ($C_3$–$C_8$)monocarboxylic acids, such as acrylic acid, methacrylic acid or crotonic acid, and ($C_4$–$C_8$)dicarboxylic acids, such maleic acid, itaconic acid, methylmalonic acid, mesaconic acid or citraconic acid, being preferred. In the preparation of the copolymers, it may also be useful to use acid derivatives, in particular acid anhydrides.

Suitable ($C_1$–$C_{30}$) alkanols (A) include any desired, and include methanol, ethanol, propanol, isopropanol, butanol, isobutanol, sec-butanol, tert-butanol, pentanol, hexanol, 2-ethylhexanol, heptanol, octanol, decanol, dodecanol, tridecanol, tetradecanol, pentadecanol, octadecanol, eicosanol, and hexacosanol. ($C_{10}$–$C_{15}$)alkanols as obtainable by the oxo process (and therefore also referred to as "oxo alcohols") are preferred.

Any $C_8$–$C_{25}$ alkanoic acids can be used. Preferred ($C_8$–$C_{25}$)alkanoic acids include octanoic (=caprylic acid), nonanoic acid (=pelargonic acid), decanoic acid (=capric acid), undecanoic acid, dodecanoic acid (=lauric acid), tridecanoic acid, tetradecanoic acid (=myristic acid), pentadecanoic acid, hexadecanoic acid (=palmitic acid), octadecanoic acid (=stearic acid), eicosanoic acid (=arachidic acid), docosanoic acid (=behenic acid), and tetracosanoic acid (=lignoceric acid).

Any $C_1$–$C_{12}$ alkylphenols can be used. The ($C_1$–$C_{12}$) alkylphenols (A) are preferably methylphenol, butylphenol, isobutylphenol, pentylphenol, hexylphenol, octylphenol, nonylphenol, decylphenol, and dodecylphenol, the straight-chain or branched alkyl groups preferably being present in the ortho- or para-position relative to the phenolic hydroxyl group.

Any di($C_1$–$C_{20}$)alkylamines can be used. Suitable di($C_1$–$C_{20}$)alkylamines (A) include dimethylamine, ethylmethylamine, diethylamine, dipropylamine, ethylpropylamine, dibutylamine, dipentylamine, dioctylamine, ethyloctylamine, didecylamine, didodecylamine and dioctadecylamine. Among the secondary amines, those having 8 to 18 carbon atoms in each alkyl group are preferred.

A single type of compound (A) or mixtures of different (A) compounds can be used. Also, a single type of compound (B) or mixtures of different (B) compounds can be used.

Any desired $(C_2–C_4)$alkylene oxides can be used. Preferably used $(C_2–C_4)$alkylene oxides (B) include ethylene oxide and propylene oxide; however butylene oxide and isobutylene oxide or a mixture thereof may also be used. It may also be useful to carry out the reaction with two or more of the stated alkylene oxides in succession, for example, to react the compounds of (A) first with ethylene oxide and then with propylene oxide (or vice versa).

The copolymer contains units of (I) and (II) in sufficient amounts to give the desired emulsifying properties Preferred copolymers are those in which from 5 to 50%, particularly preferably from 10 to 35%, of the carboxyl groups of the ethylenically unsaturated carboxylic acid (II) are esterified. The units (I) and (II) should generally together account for at least 50 mol%, preferably at least 70 mol%, of all units in the copolymer. The amount of the units (II) should generally be at least 5 mol%, preferably at least 10 mol%.

The copolymer can be produced in any desired manner. In a preferred embodiment, the copolymer is obtainable by copolymerization of (I) at least one $(C_4–C_{28})$alkene and
  (IIa) at least one ethylenically unsaturated dicarboxylic anhydride having 4 to 8 carbon atoms, the molar ratio (I):(IIa) being in the range from 7:3 to 3:7, or
  (IIb) at least one ethylenically unsaturated monocarboxylic acid having 3 to 8 carbon atoms, the molar ratio (I):(IIb) being in the range from 1:1 to 1:5, and subsequent partial esterification of the carboxyl groups of the copolymer with reaction products of
  (A) $(C_1–C_{30})$alkanols, $(C_8–C_{22})$fatty acids, $(C_1–C_{12})$alkylphenols or secondary $(C_2–C_{30})$amines with
  (B) at least one $(C_2–C_4)$alkylene oxide or tetrahydrofuran, the molar ratio (A):(B) being in the range from 1:2 to 1:50, and hydrolysis of any anhydride groups of the copolymer to carboxyl groups or salts thereof (preferably alkaline earth metal or alkali metal salts, in particular K or Na salts), the partial esterification being continued until between 5 and 50% of the carboxyl groups of the copolymer have been esterified.

The copolymers used in the developer according to the invention may also be obtainable by copolymerization of (I) with the reaction products (IIa) or (IIb) with (A) and (B) in the abovementioned molar ratio.

The copolymers can moreover contain up to 50 mol%, preferably 10 to 40 mol%, of other units. Particularly useful further units include those of amides of monoethylenically unsaturated $(C_3–C_8)$carboxylic acids, whose amido groups correspond to the formula

-CO-NR$^1$R$^2$ in which R$^1$ is a $(C_8–C_{28})$alkyl group or a group of the formula RO-[CHR$^3$-CHR$^4$-O]n-1-CHR$^3$-CHR$^4$- and
R$^2$ is a hydrogen atom or one of the groups R$^1$,
R$^3$ and R$^4$ are identical or different and are a hydrogen atom, a methyl group or an ethyl group, R is a $(C_1–C_{28})$alkyl group and n is an integer from 2 to 100.

Examples of these polymers are described in EP-A 0 368 214 as additives to liquid detergents. EP-A 0368 214 is incorporated herein by reference in its entirety.

The copolymers used in the developer according to the invention generally have K values of from 6 to 200, preferably from 10 to 80 (determined according to H. Fikentscher in 1% strength aqueous solution at 25° C. and pH 7.5, in the form of the sodium salt), corresponding to a weight average molecular weight ($M_w$) of from 500 to 500,000, preferably from 1,000 to 150,000. The monomer units are generally randomly distributed therein; the copolymers are thus preferably not block copolymers.

Preferred components (IIa) include monoethylenically unsaturated dicarboxylic anhydrides having 4 to 8 carbon atoms, such as maleic anhydride, itaconic anhydride, mesaconic anhydride, citraconic anhydride or methylenemalonic anhydride, in particular maleic and itaconic anhydride. Suitable conditions for the preparation of the copolymers are described in detail in EP-A 0 367 049, which is incorporated herein by reference in its entirety. Among the ethylenically unsaturated $(C_3–C_8)$carboxylic acids (IIb), acrylic acid and methacrylic acid are preferred since they are available on a large industrial scale.

The copolymers typically do not acquire their specific emulsifying properties until partial esterification of their carboxyl groups with the stated reaction products of the compounds (A) and (B). These are preferably etherification products of $(C_1–C_{30})$alcohols or secondary $(C_2–C_{30})$amines (A), which have undergone an addition reaction with polyalkylene oxide chains comprising from 3 to 30 $(C_2–C_4)$ alkylene oxide units (B), preferably ethylene oxide or propylene oxide or mixtures of the two. Compounds of this type which carry an OH group on the polyalkylene oxide chain end are conventional commercial products in the form of nonionic surfactants (for example ethoxylates/propoxylates of fatty alcohols, fatty acids, fatty amides, and fatty amines).

In order to obtain readily water-soluble substances, the carboxyl groups remaining in the partially esterified copolymer after the hydrolysis are generally neutralized by reaction with alkali, ammonia, and/or alkanolamines so that finally aqueous solutions having a pH of from 4 to 10, preferably from 6 to 8, are obtained. Aqueous NaOH or KOH solutions are preferably used for the neutralization.

General Synthesis Method for Copolymers Having Units of Ethylenically Unsaturated Dicarboxylic Anhydrides (IIa)

In a polymerization reactor provided with a stirrer, a thermometer, a condenser, nitrogen inlet and outlet and metering apparatuses, an olefin or an olefin mixture (I) and an ethylenically unsaturated dicarboxylic anhydride (IIa) (cf. Table 1) and polyvinyl ethyl ether having a K value of 50 were initially introduced and were heated to 100° C. in a gentle stream of nitrogen. As soon as this temperature was reached, 1 mol% of tert-butyl peroxy-2-ethylhexanoate (30% by weight in the olefin or the olefin mixture) was added in the course of from 1 to 3 hours. The reaction mixture is heated at 100° C. for a further 2 to 4 hours. A clear solution of the copolymer in the olefin was obtained. Unconverted olefin was then distilled off under reduced pressure.

TABLE I

| Polymer | Monomer I | Molar fraction* | Monomer IIa | Molar fraction | K value** |
|---|---|---|---|---|---|
| A | Dodecene | 4 | Maleic anhydride | 6 | 9 |
| B | Diisobutene | 5 | Maleic anhydride | 5 | 13 |
| C | Diisobutene | 6 | Itaconic anhydride | 4 | 25 |

Synthesis Example for the Partial Esterification of the Copolymers of the Components (I) and (IIa) (Polymers 1–6)

The copolymers described above were reacted with an adduct from the reaction of ethylene oxide with an oxo alcohol in the presence of para-toluenesulfonic acid in the course of from 2 to 12 hours under reflux. The reaction mixture was then cooled to 100° C. Thereafter water and, if required, aqueous alkali or alkaline earth solution were added and stirring was carried out for a further 2 hours at from 50° C. to 70° C. The aqueous alkali or alkaline earth solution is added in such an amount as to achieve a mixture of about neutral or slightly basic pH (pH 7 to 8.5). Light brown, viscose solutions resulted.

TABLE II

| 1 | 2 | 3 | 4 | 5 | 6 | 7 | 8 |
|---|---|---|---|---|---|---|---|
| 1 | A | 25 | 1 mol of $C_{13}/C_{15}$-oxo alcohol + 7 mol of ethylene oxide (EO) | $Mg(OH)_2$ | 49.8 | 8.4 | 10.2 |
| 2 | A | 10 | 1 mol of $C_{10}$-oxo alcohol + 10 mol of EO | KOH | 53.1 | 7.0 | 13.2 |
| 3 | B | 15 | 1 mol of $C_{13}/C_{15}$-oxo alcohol + 5 mol of EO | NaOH | 48.7 | 7.2 | 16.2 |
| 4 | B | 12.5 | 1 mol of $C_{13}/C_{15}$-oxo alcohol + 7 mol of EO | KOH | 45.1 | 7.1 | 14.8 |
| 5 | C | 32.5 | 1 mol of $C_{12}/C_{14}$-oxo alcohol + 8 mol of EO | NaOH | 49.2 | 7.4 | 23.1 |
| 6 | C | 10 | 1 mol of methanol + 15 mol of EO | KOH | 51.0 | 7.1 | 19.9 |

1 Polymer
2 Starting copolymer
3 Amount of the COOH groups converted into ester, in %
4 Compound obtainable by alkoxylation of
5 Base used
6 Solids content of the aqueous solution
7 pH
8 K value of the product Synthesis Example for Copolymers Having Monomer Units of (IIb) (Polymer 7)

Diisobutene, acrylic acid and the reaction product of 7 mol of ethylene oxide with 1 mol of $C_{13}/C_{15}$-oxo alcohol and acryloyl chloride in the molar ratio of 5:3:2 were heated to 100° C. in the polymerization reactor described above. 1 mol% of tert-butyl peroxy-2-ethylhexanoate (30% by weight in diisobutene) was metered in in the course of 3 hours and stirring was carried out for a further 3 hours at 100° C. The excess olefin was then distilled off under reduced pressure and aqueous potassium hydroxide solution was added to the distillation residue so that a viscose solution having a solids content of 51.1% and a pH of 7.3 resulted. The K value of the copolymer was 25.7 (determined by the method of H. Fikentscher in aqueous solution at 25° C., pH 7.5 and a polymer concentration of 1% by weight).

In the ready-to-use form, the aqueous alkaline developer according to the invention contains one of the copolymers described, which acts as an emulsifier in an emulsifying effective amount, generally in an amount of from 0.1 to 10.0% by weight, in particular from 0.2 to 8.0% by weight, and preferably from 0.5 to 6.0% by weight, based in each case on the total weight of the ready-to-use developer. In the case of liquid concentrates, the percentage included is correspondingly higher.

The developer can be used to develop any type of recording material. The developer according to the present invention is particularly suitable for developing recording materials having a negative-working radiation-sensitive layer. It then preferably additionally contains at least one water-miscible organic solvent and at least one surface-active compound (surfactant).

The developer can include any desired compound or compounds which is alkaline in aqueous solution. This alkaline compound is preferably an alkanolamine, a hydroxide, a phosphate, or a carbonate. Preferred alkanolamines include ethanolamine, di- and triethanolamine, isopropanolamine, diisopro-panolamine, and tris(hydroxymethyl)aminomethane. Preferred hydroxides include alkali metal and alkaline earth metal hydroxides and di-, tri- and tetra($C_1$–$C_{10}$)alkylammonium hydroxides. Preferred carbonates include sodium, potassium and ammonium carbonates or bicarbonates. Of all alkaline compounds, the alkanolamines and alkali metal hydroxides are most suitable.

The amount of the alkaline compound(s) should be tailored to the type of recording material. Generally, it is 0.1 to 20% by weight, in particular from 0.5 to 10% by weight and preferably from 1.0 to 5.0% by weight, in each case based on the total weight of the ready-to-use developer. In the case of liquid concentrates, the percentage included is correspondingly higher. In general, the pH of the ready-to-use developer according to the invention is from 8.0 to 13.0, preferably from 8.5 to 11.5.

The developers can optionally include an organic solvent such as those miscible with water. In the context of the present invention, an organic solvent which, in the amount used (generally up to 20% by weight), forms a uniform solution with water at a temperature at which the developer is usually stored or used (generally about 0 to 60° C.) is defined as "miscible with water". Particularly short development times are achieved by adding one or more of the following organic solvents: alcohols, especially benzyl alcohol, ethylene glycol monophenyl ether, 1-phenylethanol, 2-phenylethanol, propylene glycol monomethyl and phenyl ether and glycerol and glyceryl acetates. The amount of organic solvent in the ready-to-use developer if included, is expediently from 0.5 to 15.0% by weight, in particular from 1.0 to 10.0% by weight and preferably from 2.0 to 6.0% by weight, based in each case on the total weight of the developer. Since only relatively small amounts of organic solvent are present in the developer, its composition is virtually unchanged during use. It thus has a relatively long life in the development apparatuses.

The developer may also include any desired surfactants. Suitable surfactants in the developer according to the invention include many inorganic surface-active compositions. In addition, mixtures of anionic with nonionic and/or zwitterionic surface-active substances can be successfully used. Anionic surfactants, such as alkali metal, preferably sodium or potassium, octylsulfates, dodecylbenzenesulfonates, alkyl-phenolethersulfates, naphthalenesulfonates, sulfosuccinates and alkyletherphos-phates, have proven particularly useful. Suitable nonionic surfactants originate from the substance classes comprising the ($C_{10}$–$C_{18}$) fatty alcohol ethoxylates, polyethylene glycols, ethylene oxide/propylene oxide (block) copolymers and alkylphenol ethoxylates and the zwitterionic surfactants of the betaine or sulfobetaine type and may account for from 0 to 80% by weight of the total amount of surfactant. The amount of the surface-active substance(s) in the developer is chosen to give effective results, and is in general from 0.2 to 12.0% by weight, preferably from 0.5 to 8.0% by weight, particularly preferably from 1.0 to 6.0% by weight, based in each case on the total weight of the developer.

Depending on the type of recording materials to be processed, the developer according to the invention may contain further additives, in particular buffer substances, complexing agents (especially those which bind calcium), antifoams, or sequestering agents. Any desired types of the optional further additives can be used, in amounts to give the desired results.

n-Alkanoic acids having 6 to 12 carbon atoms and/or salts thereof, in particular caprylic, pelargonic, capric and lauric acid, have proven useful as buffer substances in the developer according to the invention. In the ready-to-use developer, these acids may be present in an amount of from 0.5 to 8.0% by weight, in particular from 1.0 to 6.5% by weight, based on the total weight of the developer.

Suitable buffering substances include all those which are effective in the preferable pH range of from 8 to 13. In addition to the stated n-alkanoic acids and the salts thereof, in particular the generally available buffer substances selected from the group of the carbonates, phosphates, borates, alkali metal salts of glycine and amine are useful. Very common buffer systems are, for example, mixtures of carbonate/bicarbonate or phosphate/hydrogen phosphate.

The salts of low molecular weight phosphates, so-called oligo-phosphates, having 2 to 10, preferably 2 to 6, in particular 2 to 4, phosphorus units may be used as complexing agents. Particularly preferred are the alkali metal salts, in particular the sodium and potassium salts, including, for example, tetrasodium diphosphate, pentasodium triphosphate, pentapotassium triphosphate, and hexasodium tetraphosphate.

Alkali metals salts, preferably sodium salts, of nitrilotriacetic acid and of ethylenediaminetetraacetic acid, and trishydroxymethylaminomethane, also give good results. The content of complexing agents in the ready-to-use developer is expediently from 0.1 to 5.0% by weight, in particular from 0.5 to 4.0% by weight and preferably from 1.0 to 3.0% by weight.

The water content in the developer preferably comprises demineralized water and the amount of water in the ready-to-use form is generally from 70 to 95%, preferably from 75 to 90% by weight.

Moreover, the developer according to the invention may also be formulated as a concentrate, generally containing very little, or preferably no water. The amount of nonaqueous components therein is increased by up to three times of the stated amounts. Such concentrates, too, have no annoying odor, and no precipitates form even after storage at temperatures around the freezing point.

Any desired apparatus can be used to develop recording materials with the developer. In the apparatuses for the development of recording materials, a developer station, a washing station, and a gumming station are usually connected in series. Increasing contamination of the developer with layer components results in development which is slower and no longer complete. During washing, it is scarcely possible to avoid the selective removal of effective developer components, so that their components are absorbed from the entrained developer solution onto the surface of the recording material in agglomerated form and may be evident there as undesired impurities. These absorbed layer components are not dissolved and washed away by the gumming solution but only raised from the substrate surface as skin ("cake formation"). This phenomenon is effectively delayed by the developer according to the invention without the simultaneous likelihood of a considerable increase in the developer viscosity with increasing contamination with the layer components, which in turn helps to keep the amount of entrained developer small.

The developer according to the invention is suitable for processing a number of positive- and negative-working recording materials. Depending on the type of radiation-sensitive layer, the negative-working materials may be divided into those 1. having a negative-working layer based on diazonium salt poly-condensation compounds,
2. having a negative-working layer which contains olefinically unsaturated compounds capable of the radical polymerization and photopolymerization initiators, and
3. which are based on a combination of the principles stated under 1. and 2.

A negative-working layer based on diazonium salt polycondensation compounds contains, for example, condensates of diphenylamine-4-diazonium salts with aldehydes, preferably formaldehyde. Cocondensates which, in addition to the diazonium salt units, also contain other, nonphotosensitive units which are derived from condensable compounds, in particular aromatic amines, phenols, phenol ethers, aromatic thioethers, aromatic hydrocarbons, aromatic heterocycles and organic acid amides, are particularly advantageously used. Suitable diazonium salt condensates of this type are described in DE-A 20 24 244 and 27 39 774, both of which are incorporated herein by reference in their entirety.

For stabilizing the photosensitive mixture, it is often advantageous to add a compound having acid character to the mixture. Mineral acids and strong organic acids are suitable, among which phosphoric acid, sulfuric acid, perchloric acid, boric acid and para-toluenesulfonic acid are preferred. A particularly suitable acid is orthophosphoric acid.

A further main component of the negative-working layers of type 1 is at least one nonphotosensitive polymeric binder which has pendant carboxyl groups and is soluble or at least swellable in aqueous alkaline solutions. This binder may be, for example, the reaction product of an intramolecular anhydride of an organic polycarboxylic acid with a synthetic polymer containing hydroxyl groups, which contains no further functional groups capable of reacting with acid anhydrides. Functionalized binders of this type are described in detail in DE-A 34 04 366, which is incorporated herein by reference in its entirety.

Plasticizers, adhesion promoters, dyes, pigments and photochemical color formers may furthermore be added to the photosensitive mixtures.

The negative-working layer of type 2 preferably contains a combination of an ethylenically unsaturated monomer capable of radical polymerization, in particular an acrylic or methacrylic ester of a polyhydric alcohol, and a photoinitiator. Polycondensates or polymers having pendant carboxyl groups are preferably used as alkali-soluble binders in these layers.

Preferably, negative-working layers are protected by an overcoat, in particular against the admission of atmospheric oxygen. For this purpose, the overcoat usually contains polymers which give rise to reduced oxygen permeability. Particularly suitable for this purpose are polyvinyl alcohol, polyvinylpyrrolidone, or gelatine.

The developer according to the invention is also suitable for recording materials having a positive-working radiation-sensitive layer. However, the amount of the organic solvent should then be relatively small so that the image parts are not excessively attacked. This means, the amount of the organic solvent should be generally in the range of from 0.3 to 3 % by weight, relative to the total weight of the developer.

Metals are generally used as substrate material for layers having a thickness of less than about 10 μm. Usually, bright-rolled, mechanically roughened and/or electrochemically roughened and, if required, anodized aluminum, which may also have been chemically pretreated (for example with polyvinylphosphonic acid, silicates, phosphates or hexafluorozirconates), is used for offset printing plates. But, any desired substrate material can be used.

The substrate material is coated with the recording material in a known manner by, for example, spin-coating, spraying, dipping or roller-coating, by means of slot dies or doctor blades or by casting.

After the application of the layer, the recording material is irradiated imagewise and, if required, uniformly, depending on the type of layer. Conventional and useful radiation sources are, for example, tubular lamps, pulsed xenon lamps, metal halide-doped high pressure mercury vapor lamps and carbon arc lamps, depending on the application. In automatic processing units, lasers, such as argon or krypton ion lasers, are preferred. Electron radiation or X-rays may also be used for image production.

The subsequent development with the abovementioned developer is carried out as desired, and generally is carried out in spray, back-up or dip-bath development apparatuses at temperatures of from 15 to 50° C., preferably from 18 to 40° C. The duration of development is in general from 5 seconds to 1 minute, preferably from 10 to 40 seconds.

The development may be followed by further processing steps. For example, printing plates can be treated with an (acidic) hydrophilizing solution or provided with a preservation layer. To increase the stability during printing and the resistance to washout compositions, correction compositions and UV-curable printing inks, the developed plates may be briefly heated. Before the heating, so-called baking gums may also be applied.

The following embodiments are intended to illustrate the invention, without limiting it; pbw denotes part(s) by weight.

A) Negative-working Recording Material (diazo)
A coating solution comprising 1.50 pbw of a polymer prepared by heating a solution of a polyvinylbutyral (contains 71% by weight of vinylbutyral, 3% by weight of vinyl acetate and 26% by weight of vinyl alcohol units; molecular weight $M_w$ from 70,000 to 80,000) with maleic anhydride and triethylamine in methyl ethyl ketone under reflux, 1.00 pbw of a diazonium polycondensate of 1 mol of 3-methoxydiphenylamine-4-diazonium sulfate and 1 mol of 4,4'-bismethoxymethyldiphenyl ether, precipitated as mesitylene sulfonate, 0.09 pbw of Victoria Sky Blue FGA (Basic Blue 81), 0.07 pbw of benzenephosphonic acid, 0.10 pbw of a silica gel filler having a mean particle size of 3 μm and 97.24 pbw of a mixture of tetrahydrofuran and ethylene glycol monomethyl ether (40:60) was supplied to an aluminum foil roughened in hydrochloric acid, anodized in sulfuric acid and after-treated with an aqueous polyvinylphosphonic acid solution, so that the layer weight was 1.0 g/m$^2$ after drying for 2 min at 100° C.

Negative-working recording materials produced using the coating solution were exposed for 30 seconds at a distance of 110 cm in a contact printing frame through a photographic negative under a 5 kW metal halide lamp and then developed in a spay development apparatus at 24° C. and at a processing speed of 1.4 m/min (=20 second development time). The gumming station was filled with a commercial gum (AGFA ®Ozasol RC 795).

B) Developer:

In Table IIIa, various developers are compared. The developers A, B and K serve comparative purposes since they contain polymeric emulsifiers differing from those of the developers according to the invention.

TABLE IIIa

| Constutuents | Developer composition | | | | | | | | | | |
|---|---|---|---|---|---|---|---|---|---|---|---|
| | A | B | C | D | E | F | G | H | I | K | L |
| NaOH solid | — | 1.2 | 1.0 | 1.0 | 1.0 | 1.0 | 1.0 | 1.0 | 1.0 | — | — |
| KOH solid | 1.5 | — | — | — | — | — | — | — | — | — | — |
| 1-Amino-propan-2-ol | — | — | — | — | — | — | — | — | — | 1.5 | 1.5 |
| Tris-hydroxymethyl-aminomethane | 1.0 | 1.0 | 1.0 | 1.0 | 1.0 | 1.0 | 1.0 | 1.0 | 1.0 | 1.0 | 1.0 |
| Octylsulfate | 2.0 | 2.0 | 2.0 | 2.0 | 2.0 | 2.0 | 2.0 | 2.0 | 2.0 | 3.0 | 3.0 |
| 2-Phenoxyethanol | 3.0 | 3.0 | 3.0 | 3.0 | 3.0 | 3.0 | 3.0 | 3.0 | 3.0 | 4.0 | 4.0 |
| Pelargonic acid | 4.0 | 4.0 | 4.0 | 4.0 | 4.0 | 4.0 | 4.0 | 4.0 | 4.0 | — | — |
| NaH$_2$PO$_4$ | 0.5 | 0.5 | 0.5 | 0.5 | 0.5 | 0.5 | 0.5 | 0.5 | 0.5 | — | — |
| Pentasodium triphosphate | 2.0 | 2.0 | 2.0 | 2.0 | 2.0 | 2.0 | 2.0 | 2.0 | 2.0 | — | — |
| Polymer I[1] | 0.5 | — | — | — | — | — | — | — | — | 0.5 | — |
| Polymer II[2] | — | 1.0 | — | — | — | — | — | — | — | — | — |
| Polymer (Synthesis Example No. 1 to 7) | — | — | 2.0 (1) | 2.0 (2) | 2.0 (3) | 2.0 (4) | 2.0 (5) | 2.0 (6) | 2.0 (7) | — | 3.0 (4) |
| Water demineralised | to 100 % | | | | | | | | | | |

[1]Copolymer of N-Vinyl-N-methylacetamid and dioctyl maleate; $M_w$ about 20,000 (From EP-B 0 027 932 incorporated by reference in its entirety)
[2]Copolymer of N-Vinylpyrrolidone and vinyl acetate (VP/VA = 70/30; K value34; $M_w$ 20,000 ± 5,000 (From EP-B 0 323 836 incorporated by reference in its entirety)

Table IIIb contains the test results for comparison. The plates developed with the developer according to the invention were in all cases free of stains, the solid color areas were reproduced without missing parts or other damage due to removal of the layer, and the 60-line screen had a coverage of from 2 to 98%. Development was carried out in each case to a final loading of 20 $m^2/l$.

In addition, the following measured quantities were evaluated:
- viscosity of the developer solution before and after completion of the loading test;
- plate area per liter of developer [$m^2/l$] until redeposit-free development is possible without problems.

Table IIIb shows that the developers according to the invention either:
- exhibit a measurably smaller viscosity increase with comparable development power (until the occurrence of layer redeposits after gumming) and/or they
- additionally have a more advantageous development power in conjunction with comparable viscosity increase or even a viscosity increase smaller than that of the comparative examples.

TABLE IIIb

| Developer Formulation | Viskositat ($mm^2/s$) Fresh | Viskositat ($mm^2/s$) after 20 $m^2/l$ | Plate area developable without redeposition ($m^2/l$) |
|---|---|---|---|
| A* | 2.6224 | 4.0320 | 13.0 |
| B* | 2.1909 | 3.3693 | 6.0 |
| C | 1.6054 | 2.5087 | 13.5 |
| D | 1.7896 | 2.7134 | 14.5 |
| E | 1.9783 | 3.1375 | 13.0 |
| F | 1.8245 | 2.8353 | 17.5 |
| G | 2.1079 | 3.5076 | 16.5 |
| H | 1.9985 | 2.9854 | 13.0 |
| I | 1.8085 | 2.9023 | 12.5 |
| K* | 2.2086 | 3.9680 | 10.5 |
| L | 1.8718 | 2.8897 | 15.0 |

*Comparative examples

German Application 19755295.1 filed Dec. 12, 1997, the priority document of the present application, is hereby incorporated by reference in its entirety.

Although only a few exemplary embodiments of this invention have been described in detail above, those skilled in the art will readily appreciate that many modifications are possible in the exemplary embodiments without materially departing from the teachings and advantages of this invention. Accordingly, all such modifications are intended to be included within the scope of this invention.

We claim:

1. A developer for irradiated, radiation-sensitive recording materials comprising:
   (a) water,
   (b) at least one compound which is alkaline in aqueous solution, and
   (c) at least one copolymer acting as an emulsifier and comprising units of
      (I) at least one hydrophobic vinyl compound which has one or more alkyl radicals having up to 30 carbon atoms, and
      (II) at least one hydrophilic, ethylenically unsaturated carboxylic acid, at least a portion of the carboxyl groups in this unit being esterified with a reaction product of
         (A) one or more of ($C_1$–$C_{30}$)alkanols, ($C_8$–$C_{25}$) alkanoic acids, ($C_1$–$C_{12}$)alkylphenols, or di($C_1$–$C_{20}$)alkylamines with
         (B) one or more of ($C_2$–$C_4$)alkylene oxides or tetrahydrofuran, wherein the molar ratio of (A): (B) in the reaction product is in the range from 1:2 to 1:50.

2. A developer as claimed in claim 1, where from 5 to 50% of the carboxyl groups of the ethylenically unsaturated carboxylic acid (II) have been esterified with said reaction product.

3. A developer as claimed in claim 1, wherein the units (I) and (II) together account for at least 50 mol% of all monomer units in the copolymer, and the units (II) account for at least 5 mol% of all monomer units in the copolymer.

4. A developer as claimed in claim 1, wherein the copolymer is obtained by copolymerization of
   (I) at least one ($C_4$–$C_{28}$)alkene, and
   (IIa) at least one ethylenically unsaturated dicarboxylic anhydride having 4 to 8 carbon atoms, wherein the molar ratio (I):(IIa) is in the range from 7:3 to 3:7, or
   (IIb) at least one ethylenically unsaturated monocarboxylic acid having 3 to 8 carbon atoms, wherein the molar ratio (I):(IIb) is in the range from 1:1 to 1:5, to give a product, and subsequent partial esterification of the product with a reaction product of
   (A) one or more of($C_1$–$C_{30}$)alkanols, ($C_8$–$C_{22}$)fatty acids, ($C_1$–$C_{12}$)-alkylphenols or secondary ($C_2$–$C_{30}$)amines with
   (B) at least one ($C_2$–$C_4$)alkylene oxide or tetrahydrofuran, wherein the molar ratio (A):(B) is in the range from 1:2 to 1:50, and hydrolysis of any anhydride groups of the copolymer to carboxyl groups or salts thereof, the partial esterification of the copolymers being continued until between 5 and 50% of the carboxyl groups of the product have been esterified.

5. A developer as claimed in claim 1, wherein the copolymer additionally contains 10 to 50 mol% of units of one or more amides of one or more monoethylenically unsaturated ($C_3$–$C_8$)carboxylic acids, whose amido groups correspond to the formula $$-CO-NR^1R^2$$

in which
   $R^1$ is a ($C_8$–$C_{28}$)alkyl group or a group of the formula RO-$(CHR^3-CHR^4-O)_{n-1}$-$CHR^3$-$CHR^4$- and
   $R^2$ is a hydrogen atom or one of the groups $R^1$,
   $R^3$ and $R^4$ are identical or different and are a hydrogen atom, a methyl group, or an ethyl group,
   R is a ($C_1$–$C_{28}$)alkyl group, and
   n is an integer from 2 to 100.

6. A developer as claimed in claim 1, wherein the copolymer has a weight average molecular weight $M_w$ of from 500 to 500,000.

7. A developer as claimed in claim 1, wherein the developer comprises from 0.1 to 10.0% by weight of the copolymer, based on the total weight of the developer.

8. A developer as claimed in claim 1, which additionally comprises a water-miscible organic solvent and at least one surface-active compound, and optionally also one or more of a buffer substance, a complexing agent, or an antifoam.

9. A developer as claimed in claim 1, wherein the developer comprises 0.1 to 20% by weight of the compound which is alkaline in aqueous solution, based on the total weight of the developer.

10. A developer as claimed in claim 1, wherein the compound which is alkaline in aqueous solution comprises one or more of an alkanolamine, a hydroxide, or a carbonate.

11. A developer as claimed in claim 1, which has a pH from 8.0 to 13.0.

12. A developer as claimed in claim 8, wherein the developer comprises from 0.5 to 15% by weight of the water-miscible organic solvent, based on the total weight of the developer.

13. A developer as claimed in claim 8, wherein the water-miscible organic solvent comprises one or more of benzyl alcohol, ethylene glycol monophenyl ether, 1-phenylethanol, 2-phenylethanol, propylene glycol monomethyl ether, or propylene glycol phenyl ether.

14. A developer as claimed in claim 8, wherein the developer comprises from 0.2 to 12% by weight of the surface-active compound, based on the total weight of the developer.

15. A developer as claimed in claim 14, wherein the surface-active compound comprises one or more of sodium or potassium octylsulfate, sodium or potassium dodecylbenzenesulfonate, sodium or potassium alkylphenolethersulfate, sodium or potassium naphthalenesulfonate, sodium or potassium sulfosuccinate, or sodium or potassium alkyletherphosphate.

16. A method for developing radiation-sensitive materials with the developer as claimed in claim 1, comprising treating a recording material having an irradiated, radiation-sensitive negative-working layer, with said developer to develop the recording material.

17. A method as claimed in claim 16, wherein the negative-working layer contains as a binder, a reaction product of an intramolecular anhydride of an organic polycarboxylic acid with a synthetic polymer containing one or more hydroxyl groups, which contains no further functional groups capable of reacting with acid anhydrides.

18. A method as claimed in claim 16, wherein the negative-working layer contains (a) a diazonium salt polycondensation compound, (b) a combination of ethylenically unsaturated compounds capable of free radical polymerization and a photoinitiator, or (c) a mixture of (a) and (b).

19. A developer for an irradiated, radiation-sensitive recording material in the form of a liquid concentrate comprising:

at least one compound which is alkaline in aqueous solution, and at least one copolymer comprising units of
(I) at least one hydrophobic vinyl compound which has one or more alkyl radicals having up to 30 carbon atoms and
(II) at least one hydrophilic, ethylenically unsaturated carboxylic acid, some of the carboxyl groups in this unit esterified with a reaction product of
(A) one or more $(C_1-C_{30})$alkanols, $(C_8-C_{25})$alkanoic acids, $(C_1-C_{12})$alkylphenols, or di$(C_1-C_{20})$alkylamines with
(B) $(C_2-C_4)$alkylene oxides or tetrahydrofuran, wherein the molar ratio of (A):(B) in the reaction product is in the range from 1:2 to 1:50.

20. A method of developing an irradiated radiation sensitive layer, comprising treating the layer with a developer as claimed in claim 1.

* * * * *